(12) United States Patent
Hu et al.

(10) Patent No.: US 9,711,529 B2
(45) Date of Patent: Jul. 18, 2017

(54) 3D NAND DEVICE AND FABRICATION METHOD THEREOF

(71) Applicant: Semiconductor Manufacturing International (Shanghai) Corporation, Shanghai (CN)

(72) Inventors: Huayong Hu, Shanghai (CN); Lei Ye, Shanghai (CN)

(73) Assignee: SEMICONDUCTOR MANUFACTURING INTERNATIONAL (SHANGHAI) CORPORATION, Shanghai (CN)

(*) Notice: Subject to any disclaimer, the term of this patent is extended or adjusted under 35 U.S.C. 154(b) by 0 days.

(21) Appl. No.: 15/144,901

(22) Filed: May 3, 2016

(65) Prior Publication Data

US 2016/0329345 A1    Nov. 10, 2016

(30) Foreign Application Priority Data

May 5, 2015  (CN) .......................... 2015 1 0225546

(51) Int. Cl.
| | |
|---|---|
| *H01L 29/76* | (2006.01) |
| *H01L 27/11582* | (2017.01) |
| *H01L 21/28* | (2006.01) |
| *H01L 21/311* | (2006.01) |
| *H01L 21/027* | (2006.01) |

(Continued)

(52) U.S. Cl.
CPC .... *H01L 27/11582* (2013.01); *H01L 21/0273* (2013.01); *H01L 21/28273* (2013.01); *H01L 21/28282* (2013.01); *H01L 21/31116* (2013.01); *H01L 21/31138* (2013.01); *H01L 21/31144* (2013.01); *H01L 21/76805* (2013.01); *H01L 21/76877* (2013.01); *H01L 27/11556* (2013.01);

(Continued)

(58) Field of Classification Search
CPC ......... H01L 27/11582; H01L 21/76877; H01L 21/31144; H01L 21/0273; H01L 21/76805; H01L 21/28273; H01L 21/28282; H01L 21/31116; H01L 29/4916; H01L 29/495; H01L 27/11556; H01L 21/31138
See application file for complete search history.

(56) References Cited

U.S. PATENT DOCUMENTS

| 9,070,447 B2* | 6/2015 | Chen | ............... H01L 27/1157 |
| 9,406,609 B1* | 8/2016 | Lung | ............... H01L 21/76816 |
| 2016/0020169 A1* | 1/2016 | Matsuda | ............ H01L 23/528 |
| | | | 257/758 |

* cited by examiner

*Primary Examiner* — Stephen W Smoot
*Assistant Examiner* — Vicki B Booker
(74) *Attorney, Agent, or Firm* — Annova Law Group, PLLC

(57) ABSTRACT

A method for forming a 3D NAND structure includes providing a semiconductor substrate; forming a control gate structure having a plurality of staircase-stacked layers, each layer has a first end and a second end; forming a dielectric layer covering the semiconductor substrate, and the control gate structure; forming a hard mask layer on the dielectric layer; patterning the hard mask layer to form a plurality of openings above corresponding second ends of the layers of the control gate structure; forming a photoresist layer on the hard mask layer; repeating a photoresist trimming process and a first etching process to sequentially expose the openings, and to form a plurality of holes with predetermined depths in the dielectric layer; performing a second etching process to etch the plurality of holes until surfaces of the second ends are exposed to form through holes; and forming metal vias in the through holes.

15 Claims, 8 Drawing Sheets

(51) Int. Cl.
*H01L 21/768* (2006.01)
*H01L 29/49* (2006.01)
*H01L 27/11556* (2017.01)

(52) U.S. Cl.
CPC ........ *H01L 29/495* (2013.01); *H01L 29/4916* (2013.01)

3D NAND DEVICE AND FABRICATION METHOD THEREOF

CROSS-REFERENCES TO RELATED APPLICATIONS

This application claims the priority of Chinese patent application No. 201510225546.1, filed on May 5, 2015, the entirety of which is incorporated herein by reference.

FIELD OF THE INVENTION

The present invention generally relates to the field of semiconductor technology and, more particularly, relates to 3D NAND devices and fabrication processes thereof.

BACKGROUND

Flash memory devices have recently been through a rapid development. The flash memory devices are able to retain the stored data for a very long period of time without applying a voltage. Further, the reading rate of the flash memory devices is relatively high; and it is easy to erase stored data and rewrite data into the flash memory devices. Thus, the flash memory devices have been widely used in micro-computers, and automatic control systems, etc. To increase the bit density and reduce the bit cost of the flash memory devices, three-dimensional (3D) NAND (Not AND) flash memory devices have been developed.

FIG. 1 illustrates an electric circuitry diagram of a 3D NAND device. As shown in FIG. 1, the circuitry of the 3D NAND device includes bit lines (BLs), upper selecting gates (Upper SGs), control gates (CGs), lower selecting gates (lower SGs), and source lines (SLs), etc. The SLs maintain the unidirectional current output from the memory array. A certain memory may be selected from three-dimensional respectively using the selecting signal of the BLs, the common selecting signal of the upper SGs and the lower SGs, and the selecting signal of the CGs. The selecting signal of the CGs may control the selecting of a certain lateral layer of memory.

FIG. 2 illustrates the structure of a 3D NAND device. As shown in FIG. 2, the 3D NAND device includes a plurality of layers of memory structures (or memory array) 36; and a lower selecting gate LS disposed under the memory structures 36. Further, the 3D NAND device also includes an upper selecting gate US disposed right on the top of the memory structures 36; and bit lines BLs disposed over the upper selecting gate US. Further, the 3D NAND device also include a control gate CG (101) protruding from each layer of the plurality of layers of memory structures 36. Each layer of memory structures 36 are electrically connected with the control-voltage-signal-input-lines 29 through the contact vias 207 extending from the control gate CG (101).

The source region and the drain region of the memory transistor in the memory array are formed by layer-doped regions in polysilicon pillars. The memory gates are the oxide-nitride-oxide (ONO) layers surrounding the polysilicon (poly-Si) pillars. Specifically, a memory transistor includes a poly-Si body, charge trap layers and a poly-Si gate.

The control gate CG (101) of each layer of memory structure 36 may protrude from the memory structure 36; and may be electrically connected to the control-voltage-signal-input-lines 29 through metal vias 107. The control-voltage-signal-input-lines 29 may be configured as bit lines. The control gate CG (101) layers are stacked with a staircase shape from the bottom to the top. The metal vias 107 are a staggered aligned along the staircase to connect with the different bit lines (the control-voltage-signal-input-lines 29).

However, during the fabrication of the 3D NAND device, it may have etching damages to certain structures of the 3D NAND device. The etching damages may adversely affect the performance of the 3D NAND device. For example, the contact between the metal via and the control gate may not match the designed requirement, etc. Thus, the performance of the 3D NAND device may need further improvements. The disclosed device structures and methods are directed to solve one or more problems set forth above and other problems.

BRIEF SUMMARY OF THE DISCLOSURE

One aspect of the present disclosure includes a method for fabricating a 3D NAND device. The method includes providing a semiconductor substrate; forming a control gate structure having a plurality of staircase stacked layers and memory structures on the semiconductor substrate, each layer in the control gate structure has a first end and a second end opposing to the first end; forming a dielectric layer covering the semiconductor substrate, the memory structures, and the control gate structure; forming a hard mask layer on the dielectric layer; patterning the hard mask layer to form a plurality of openings above corresponding second ends of the plurality of layers of the control gate structure; forming a photoresist layer on the hard mask layer and in the plurality of openings; repeating a photoresist trimming process and a first etching process to sequentially expose the plurality of openings, and to form a plurality of holes with predetermined depths in the dielectric layer above the corresponding second ends; performing a second etching process to etch the plurality of holes until surfaces of the second ends are exposed to form a plurality of through holes; and forming a metal via in etch of the through-through holes.

Another aspect of the present disclosure includes a 3D NAND device. The 3D NAND device includes a semiconductor substrate having a first region and at least one second region; and multiple-layer stacked memory structures formed on the semiconductor substrate in the first region. The 3D NAND device also includes a control gate structure having a plurality of staircase-stacked layers from a bottom layer to a top layer formed on the semiconductor substrate in the first region, each layer of the control gate structure having a first end electrically connected with a corresponding layer of memory structures, and a second end; and a dielectric layer covering the control gate structure and the semiconductor substrate; and a metal via electrically connected with the second end of each of the plurality of layers of the control gate structure. The metal vias are formed by forming a hard mask layer on the dielectric layer; patterning the hard mask layer to form a plurality of openings above corresponding second ends of the plurality of layers of the control gate structure; forming a photoresist layer on the hard mask layer and in the plurality of openings; repeating a photoresist trimming process and a first etching process to sequentially expose the plurality of openings and form a plurality of holes with predetermined depths in the dielectric layer above the corresponding second end; performing a second etching process to etch the plurality of holes until surfaces of the second ends are exposed to form a plurality of through holes; and forming a metal via in etch of the plurality of through holes.

Other aspects of the present disclosure can be understood by those skilled in the art in light of the description, the claims, and the drawings of the present disclosure.

DETAILED DESCRIPTION

Reference will now be made in detail to exemplary embodiments of the invention, which are illustrated in the accompanying drawings. Wherever possible, the same reference numbers will be used throughout the drawings to refer to the same or like parts.

Figure 17:
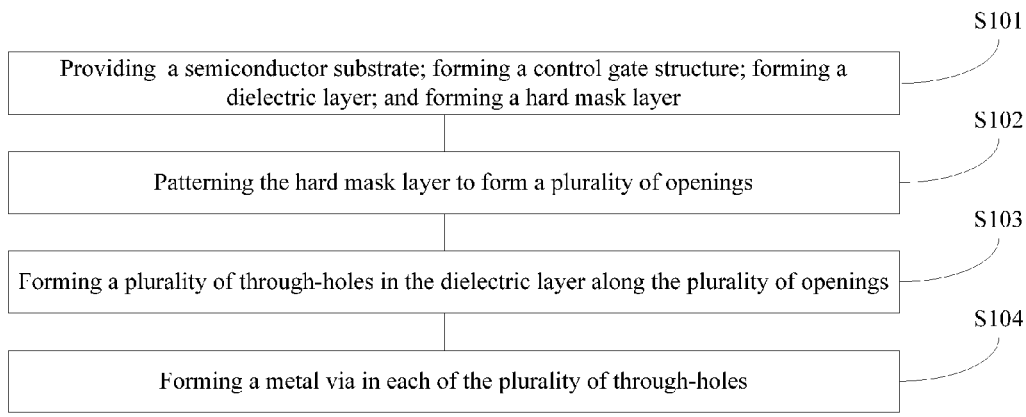
FIG. 17 illustrates an exemplary fabrication process of a 3D NAND device consistent with the disclosed embodiments.

FIG. 17 illustrates an exemplary fabrication process of a 3D NAND device consistent with the disclosed embodiments. FIGS. 3-6 illustrate structures corresponding to certain stages of the exemplary fabrication process.

Figure 1:
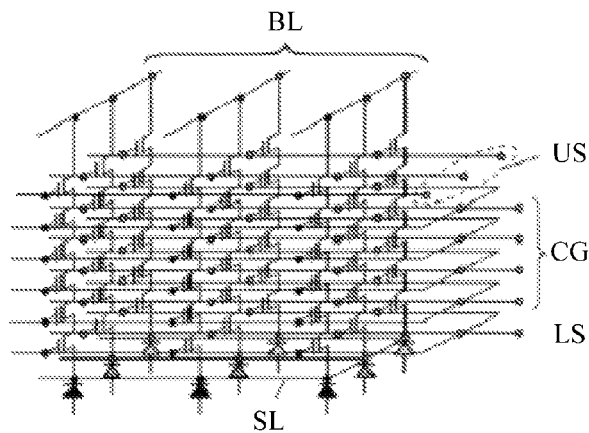
FIG. 1 illustrates an electric circuitry diagram of an existing 3D NAND device.
Figure 2:
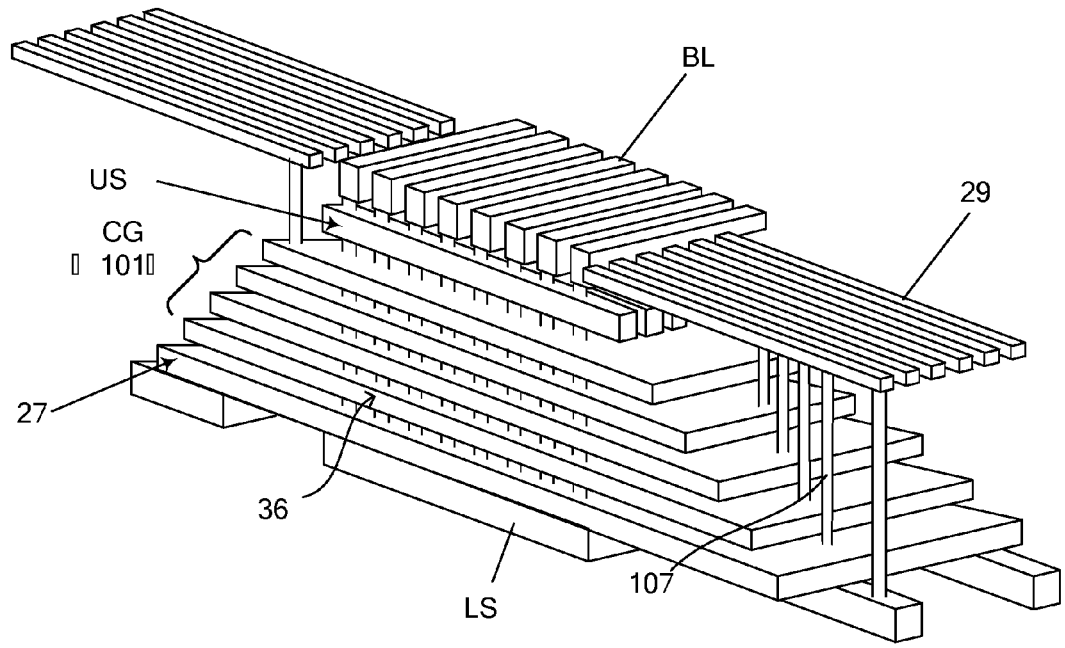
FIG. 2 illustrates a structure of an existing 3D NAND device.
Figure 3:
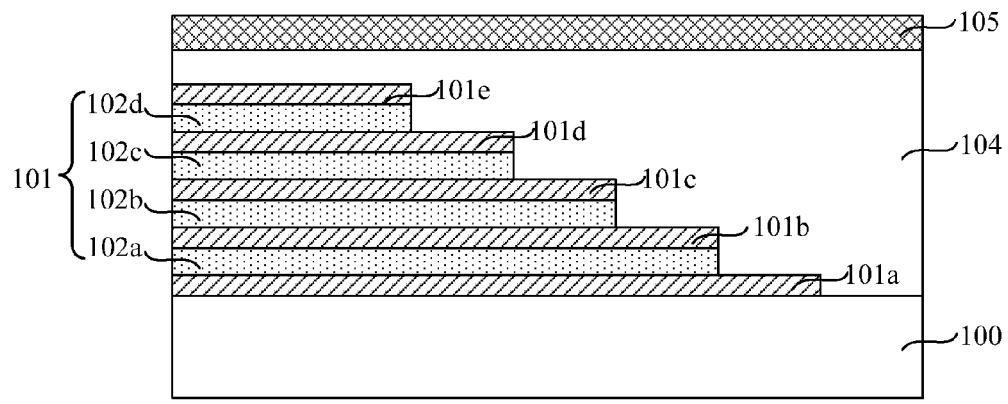
FIGS. 3-6 illustrate structures corresponding to certain stages of an exemplary fabrication process of a 3D NAND device consistent with the disclosed embodiments.

As shown in FIG. 17, at the beginning of the fabrication process, a semiconductor substrate with certain structures is provided (S101). FIG. 3 illustrates a corresponding semiconductor structure.

As shown in FIG. 3, a semiconductor substrate 100 is provided. The semiconductor substrate 100 may have a first region (not shown) and a second region (not labeled). A plurality of layers of memory structures may be formed on the semiconductor substrate in the first region (not shown).

Further, a control gate structure 101 may be formed on the semiconductor substrate 100 in the second region. The control gate structure 101 may be a multiple-layer stacked structure. Each layer of the control gate structure 101 may have a first end (not labeled) and a second end opposing the first end (not labeled). The first end of the each layer of the control gate 101 may be electrically connected with the corresponding memory structures in the same layer. The size of the second ends of the plurality of layers of the control gate structure 101 may be sequentially reduced with steps from the bottom layer to the top layer. That is, the second ends of the plurality of layers of the control gate structure 101 may sequentially be recessed with steps from the bottom layer to the top layer to form a staircase-stacked layer structure.

Further, each layer of the control gate structure 101 may include an insulation layer (102a-102d) and a conductive layer (101b-101e) formed on the insulation layer. Referring to FIG. 3, the insulation layer between the bottom conductive layer 101a and the semiconductor substrate 100 is not illustrated.

Further, a dielectric layer 104 may be formed on the semiconductor substrate 100 and the control gate structure 101. The dielectric layer 104 may cover the semiconductor structure 100 and the control gate structure 101. Further, a hard mask layer 105 may be formed on the dielectric layer 104.

Figure 4:
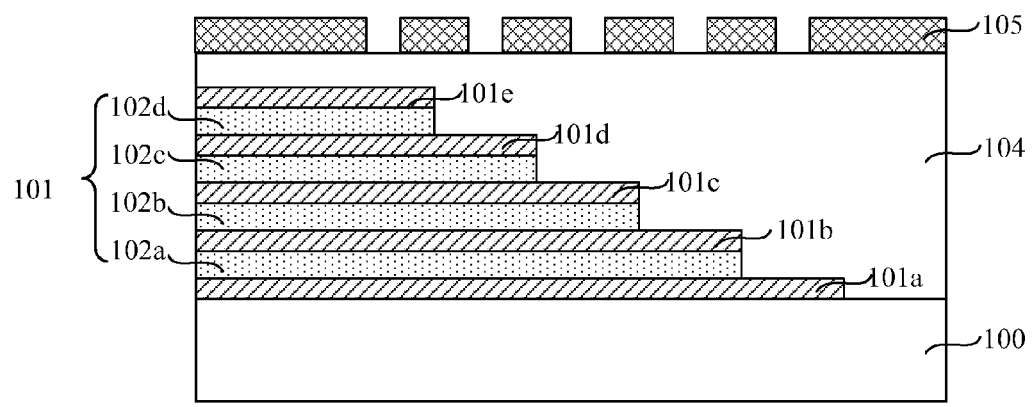

Returning to FIG. 17, after forming the hard mask layer 105, the hard mask layer 105 may be patterned (102). FIG. 4 illustrates a corresponding semiconductor structure.

As shown in FIG. 4, the hard mask layer 105 is patterned. That is, a plurality of openings (not labeled) may be formed in the hard mask layer 105. The plurality of openings may be aligned from the second ends to the first ends. The plurality of openings may be right above the second ends of the plurality of layers of the control gate structure 101.

Figure 5:
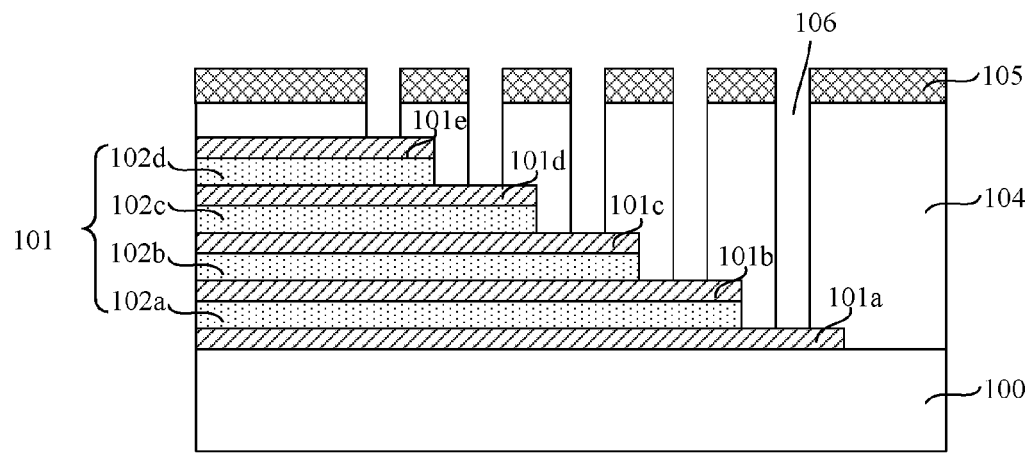

Returning to FIG. 17, after forming the plurality of openings, through holes may be formed (S103). FIG. 5 illustrates a corresponding semiconductor structure.

As shown in FIG. 5, a plurality of through holes 106 are formed in the dielectric layer 104. Each of the plurality of through holes 106 may expose the surface of the second end of the corresponding layer of the control gate structure 101. The plurality of through holes 106 may be formed by etching the dielectric layer 104 along the plurality of openings.

Figure 6:
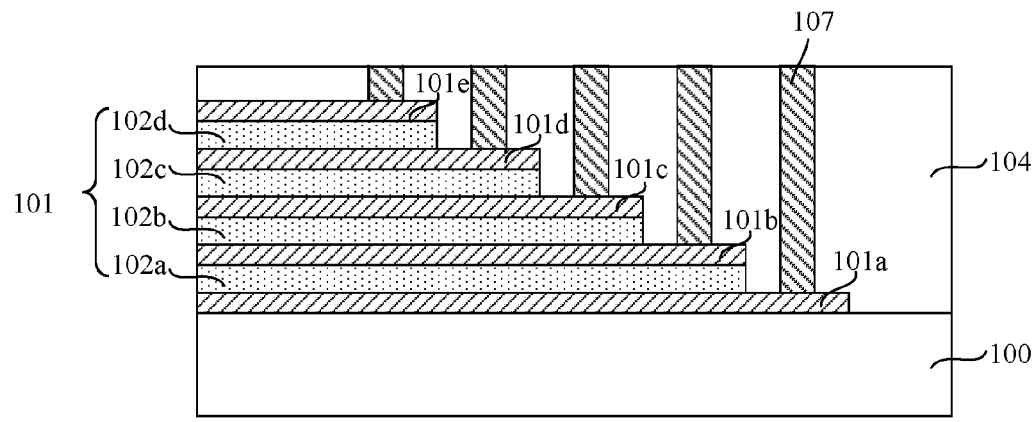

Returning to FIG. 16, after forming the plurality openings, metal vias may be formed (S104). FIG. 6 illustrates a corresponding semiconductor structure.

Figure 16:
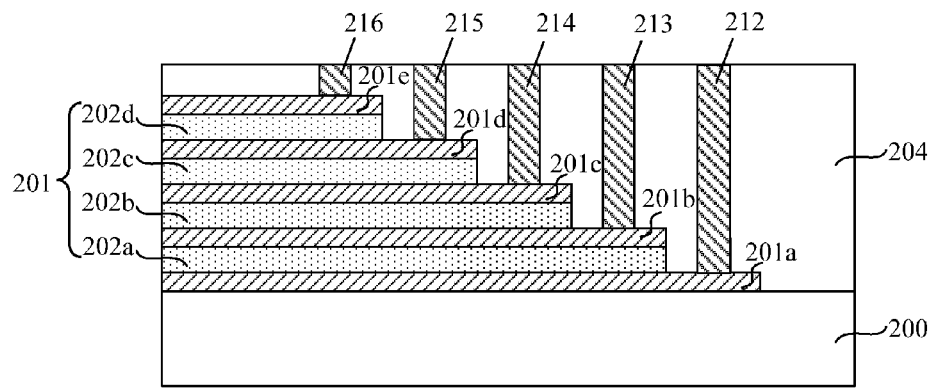

As shown in FIG. 16, a metal via 107 is formed in each of the plurality of through holes 106. Each metal via 107 may be electrically connected with the surface of the second end of the corresponding layer of the control gate 101.

Thus, a 3D NAND device may be formed. The corresponding 3D NAND device is illustrated in FIG. 6. As shown in FIG. 6, the 3D NAND device may include a semiconductor substrate 100 having a first region (not shown) and a second region (not labeled); and a multiple-layer stacked control gate structure 101 formed on the semiconductor substrate 100; and a metal via 107 electrically connected with the second end of each layer of the multiple-layer stacked control gate structure 101.

As shown in FIG. 5, the control gate structure 101 may be a multiple-layer structure, when the plurality of openings (through holes) are formed; the depths of the openings corresponding to different layers of the control gate structure 101 may be different. During the etching process for forming the through holes, when the through hole corresponding to the top layer of the control gate structure is formed, the bottom layer of the control gate structure 101 may still being etched. Thus, the etching ions may damage the control gate structure 101 on the bottom of the formed through holes. The upper the layer of the control gate structure is, the more severe of the damage is. When the metal vias are formed, the contact between the metal vias and the second ends of the control gate structure may be unable to match the designed requirements. Further, the contact performances of metal vias at different layers may be different.

Figure 18:
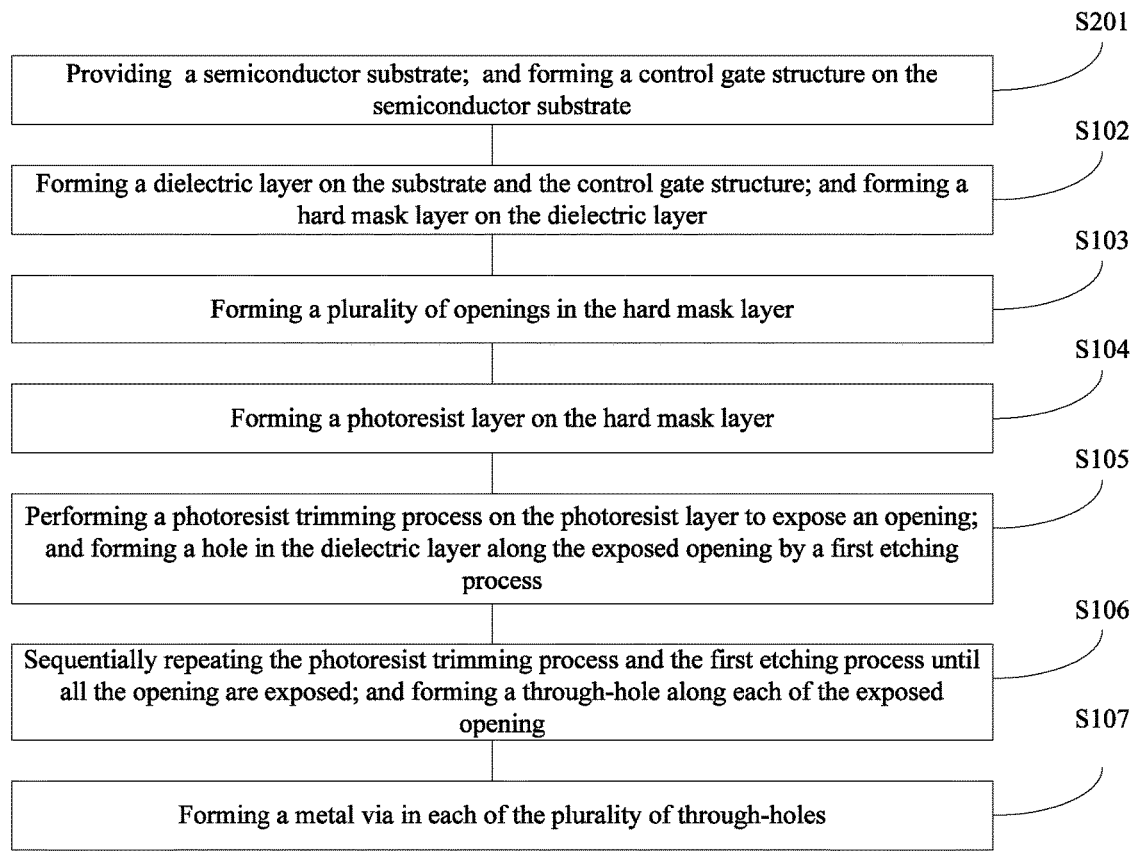
FIG. 18 illustrates another exemplary fabrication process of a 3D NAND device consistent with the disclosed embodiments.

FIG. 18 illustrates an exemplary improved fabrication method of a 3D NAND device consistent with the disclosed embodiments. FIGS. 7-16 illustrate structures corresponding to certain stages of the fabrication process.

Figure 7:
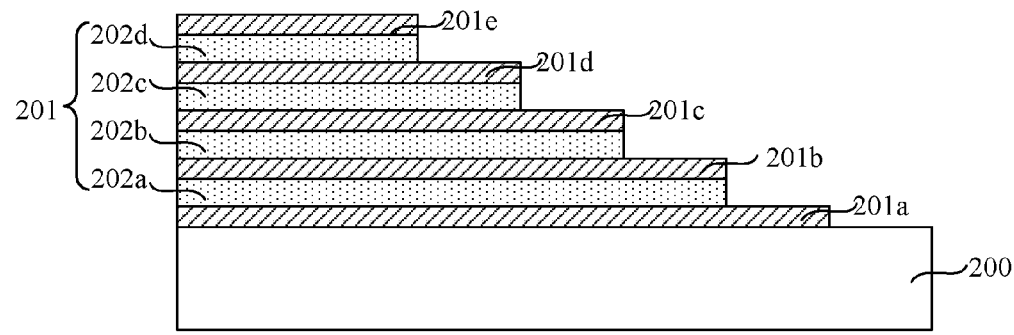
FIGS. 7-16 illustrate structures corresponding to certain stages of another exemplary fabrication process of a 3D NAND device consistent with the disclosed embodiments.

As shown in FIG. 18, at the beginning of the fabrication process, a semiconductor substrate with certain structures may be provided (S201). FIG. 7 illustrates a corresponding semiconductor structure.

As shown in FIG. 7, a semiconductor substrate 200 is provided. The semiconductor substrate 200 may include a first region (not shown) and at least one second region (not labeled). A plurality of memory structures (not shown) may be formed on the semiconductor substrate 200 in the first region.

Further, a multiple-layer stacked control gate structure 201 may be formed on the semiconductor substrate 200 in the second region. Each layer of the control gate structure 201 may include a first end (not labeled) and a second end (not labeled). The first end of each layer of the control gate structure 201 may be electrically connected with the memory structures in a same layer. The plurality of layers of the control gate structure 201 may have a staircase pattern. That is, the second end of each layer of the control gate structure 201 may be sequentially recessed from the bottom layer to the top layer.

The semiconductor substrate 200 may be made of any appropriate semiconductor materials, such as silicon, polysilicon, germanium on insulator (GOI), silicon germanium, carborundum, indium antimonite, lead telluride, indium arsenide, indium phosphide, gallium arsenide, gallium antimonite, alloy semiconductor, or a combination thereof. The semiconductor substrate 200 provides a base for subsequently device structures and processes.

In one embodiment, the number of the first region and the second region may both be one. The first region is adjacent to the second region; and the first region may be at one side of the second region.

In certain other embodiments, the number of the first region may be one; but the number of the second regions may be two. The two second regions may be at the two sides of the first region, respectively.

Each layer of the control gate structure 201 may include one insulation layer, and one conductive layer formed on the insulation layer. The insulation layer may be used to insulate adjacent conductive layers. The layer number of the control gate structure 201 may be equal to or greater than two. For example, it may be from one layer to one hundred layers, including a first layer of the control gate structure 201, a second layer of the control gate structure 201, ..., and an Nth layer of the control gate structure 201, etc. For illustrative purposes, a control gate structure 201 with five layers will be described. The control gate structure 201 may include a first layer of the control gate structure 201, a second layer of control gate structure 201, a third layer of the control gate structure 201, a fourth layer of the control gate structure 201, and a fifth layer of the control gate structure 201 distributed as a staircase from the bottom to the top of the control gate structure 201.

As shown in FIG. 7, the first layer of the control gate structure 201 may include a first insulation layer (not shown) and a first conductive layer 201*a*. The second layer of the control gate structure 201 may include a second insulation layer 202*a* and a second conductive layer 201*b* formed on the second insulation layer 202*a*. The third layer of the control gate structure 201 may include a third insulation layer 202*b* and a third conductive layer 201*c* formed on the third insulation layer 202*b*. The fourth layer of the control gate structure 201 may include a fourth insulation layer 202*c* and a fourth conductive layer 201*d* formed on the fourth layer 202*c*. The fifth layer of the control gate structure may include a fifth insulation layer 202*d* and a fifth conductive layer 201*e* formed on the fifth insulation layer 202*d*. Each layer of the control gate structure 201 may be recessed from the previous layer toward the first region (or the memory structures) for a predetermined scale from the bottom layer to the top layer.

The insulation layers may be made of any appropriate material, such as silicon oxide, silicon oxynitride, or silicon oxycarbide, etc. The conductive layers may be made of any appropriate material, such as metal material, or poly silicon, etc. In one embodiment, the insulation layers are made of silicon oxide; and the conductive layers are made of W.

Each layer of control gate structure 201 may include a first end and a second end. The first end may be electrically connected with the memory structures in the same layer. Each of the second ends may be electrically connected with a metal via subsequently formed in a dielectric layer. For the convenience of subsequent formation of the metal vias, the second ends of the plurality of layers of the control gate structure 201 may be sequentially recessed toward the memory structures from the bottom layer to the top layer of the control gate structure 201. That is, each of the plurality of layers of the control gate structure 201 may expose the adjacent bottom layer of control gate structure 201 from the top layer to the bottom layer of the control gate structure 201.

In one embodiment, the process for forming the control gate structure 201 and the memory structures may include forming a plurality of layers of staggered-stacked insulation material layers and conductive material layers crossing over the first region and the second region over the semiconductor substrate 200; etching the plurality of layers of staggered-stacked insulation material layers and conductive material layers in the second region of the semiconductor substrate 200 to form a plurality of parallel through holes penetrating through the plurality of layers of staggered-stacked insulation material layers and conductive material layers; forming a gate dielectric layer on the side surfaces of the through holes; forming a poly silicon layer on the gate dielectric layer to fill the through holes; performing etching processes to sequentially remove partial widths of the insulation material layers and the conductive material layers in the second region of the semiconductor substrate 200. Thus, the multiple-layer stacked control gate structure 201 may be formed. The size of each layer of the control gate structure 201 may be sequentially reduced from the bottom layer to the top layer. That is, the second end of each layer of the control gate structure 201 may be sequentially recessed from the bottom layer to the top layer of the control gate structure 201.

The insulation layers may be formed by any appropriate process, such as a chemical vapor deposition (CVD) process, a physical vapor deposition (PVD) process, or an atomic layer deposition (ALD) process, etc. In one embodiment, the insulation layers are formed by a CVD process. The thickness of each of the insulation material layer may be in a range of approximately 100 Å-1000 Å.

The conductive material layers may be formed by any appropriate process, such as a CVD process, a PVD process, or sputtering process, etc. The thickness of the conductive layer may be in a range of approximately 200 Å-1500 Å.

The through holes may be formed by any appropriate process, such as a dry etching process, a wet etching process, or an ion beam etching process.

The gate dielectric layer may be a single-layer structure and a multiple-layer structure. In one embodiment, the gate dielectric layer is a multiple-layer stacked structure. The gate dielectric material layer may include a first silicon oxide layer formed the side surfaces of the through holes; a silicon nitride layer formed on the first silicon oxide layer; and a second silicon oxide layer formed on the silicon nitride layer. The first silicon oxide layer, the second silicon oxide layer and the silicon nitride layer may be formed by any appropriate process, such as a CVD process, an ALD process, or a flowable CVD (FCVD) process, etc.

The polysilicon layer may be formed by any appropriate process, such as a CVD process, or an FCVD process, etc.

Various processes may be used to etch the insulation material layers and the conductive material layers to form the control gate structure 201, such as a dry etching process, a wet etching process, or an ion beam etching process, etc.

Figure 8:
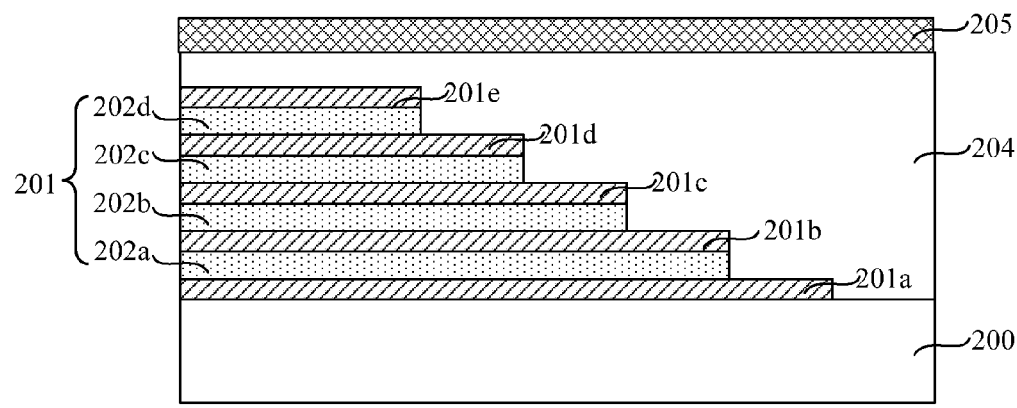

Returning to FIG. 18, after forming the control gate structure 201, a dielectric layer and a hard mask layer may be formed (S102). FIG. 8 illustrates a corresponding semiconductor structure.

As shown in FIG. 8, a dielectric layer 204 is formed; and a hard mask layer 205 is formed on the dielectric layer 204. The dielectric layer 204 may cover the semiconductor substrate 200, the memory structures (not shown), and the control gate structure 201. The hard mask layer 205 may be subsequently used as a mask for forming through holes in the dielectric layer 204.

The dielectric layer 204 may be made of any appropriate material, such as silicon oxide, or silicon oxynitride, etc. The thickness of the dielectric layer 204 may be greater than the thickness of the control gate structure 201.

The hard mask layer 205 may be a metal hard mask layer, or an inorganic hard mask layer, etc. The metal hard mask layer may be made of metal nitride, such as TiN, or TaN, etc. The inorganic hard mask layer may be made of SiN, SiC, SiOC, or SiON, etc.

The hard mask layer 205, the dielectric layer 204 and the subsequently formed photoresist layer may be made of different materials. When the photoresist layer is subsequently trimmed, the photoresist layer and the hard mask layer 205 and the dielectric layer 204 may have a relatively high etching selectivity. Further, the hard mask layer 205 and the dielectric layer 204 may also have a relatively large etching selectivity.

The dielectric layer 204 may be formed by any appropriate process, such as a CVD process, or an FCVD process, etc. The hard mask layer 205 may be formed by any appropriate process, such as a CVD process, a PVD process, or an FCVD process, etc.

Figure 9:
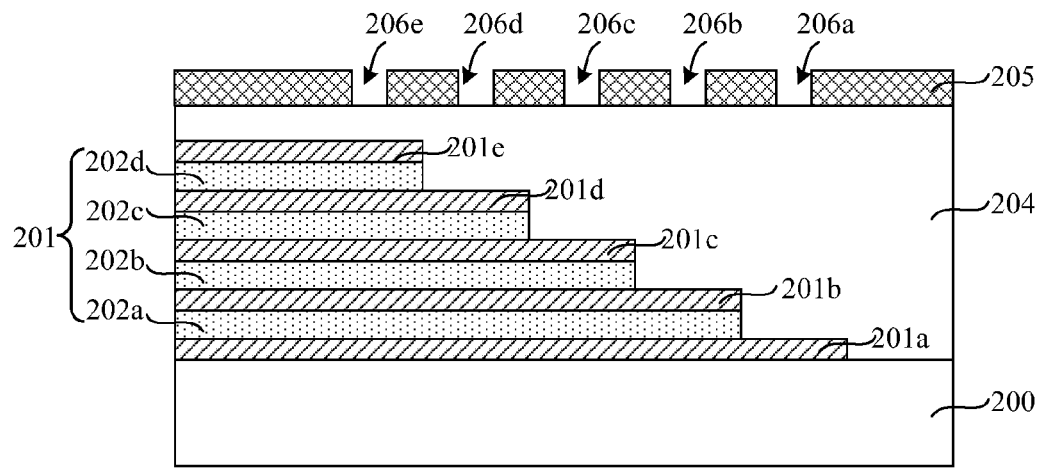

Returning to FIG. 18, after forming the hard mask layer 205, a plurality of openings may be formed (S103). FIG. 9 illustrates a corresponding semiconductor structure.

As shown in FIG. 9, a plurality of openings (206a-206e) are formed in the hard mask layer 205. The plurality of openings (206a-06e) may be distributed in the hard mask layer 205 along a direction from the second end to the first end of the control gate structure 201. The plurality of the openings (206a-206e) may be formed right above the second ends of the plurality of layers of the control gate structure 201.

The plurality of openings may be formed by patterning the hard mask layer 205. Specifically, a process for patterning the hard mask layer 205 may include forming a pattern photoresist layer on the hard mask layer 205, followed by etching the hard mask layer 205 using the patterned photoresist layer as an etching mask until the surface of the dielectric layer 204 is exposed. Thus, the plurality of the openings may be formed; and the plurality of the openings may expose the surface of the dielectric layer 204. After forming the plurality of openings, the patterned photoresist layer may be removed.

The plurality of openings formed in the hard mask layer 205 may include a first opening, a second opening, . . . , and an Nth opening (N≥2) distributed along a direction from the first end to the second end. In one embodiment, as shown in FIG. 9, the plurality of openings include a first opening 206a, a second opening 206b, a third opening 206c, a fourth opening 206d and a fifth opening 206e distributed along the direction from the first end to the second end.

The first opening 206a may be right above the second end of the first layer of the control gate structure 201 (or the first conductive layer 201a). The second opening 206b may be right above the second end of the second layer of the control gate structure 201 (or the second conductive layer 201b). The third opening 206c may be right above the second end of the third layer of the control gate structure 201 (or the third conductive layer 201c). The fourth opening 206d may be right above the second end of the fourth layer of the control gate structure 201 (or the fourth conductive layer 201d). The fifth opening 206e may be right above the second end of the fifth layer of the control gate structure 201 (or the fifth conductive layer 201e).

The number of the first opening, the number of the second opening, the number of the third opening, the number of the fourth opening and the number of the fifth opening may be equal to or greater than one.

The hard mask layer 205 may be etched by any appropriate process, such as a dry etching process, or a wet etching process, etc. The patterned photoresist layer may be removed by any appropriate process, such as a dry etching process, a wet etching process, or a plasma ashing process, etc.

Figure 10:
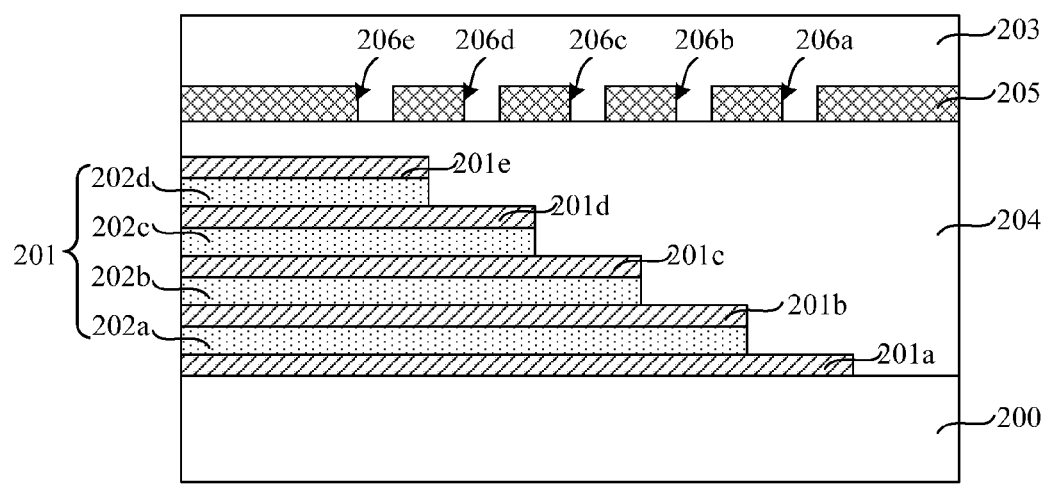

Returning to FIG. 18, after forming the plurality of the openings (206a-206e), a photoresist layer may be formed (S104). FIG. 10 illustrates a corresponding semiconductor.

As shown in FIG. 10, a photoresist layer 203 is formed on the patterned hard mask layer 205. The photoresist layer 203 may also fill the plurality of openings (206a-206e).

The photoresist layer 203 may be formed by any appropriate process. In one embodiment, the photoresist layer 203 is formed by a spin-coating process.

The photoresist layer 203 may be subsequently used as a sacrificial layer for sequentially expose the plurality of openings (206a-206e). During the subsequent trimming process of the photoresist layer 203 for sequentially exposing the plurality of openings (206a-206e), the thickness and the width of the photoresist layer 203 may be reduced. Thus, to ensure the photoresist layer 203 to be able to sequentially expose the plurality of openings (206a-206e), the thickness of the photoresist layer 203 may be relatively large. In one embodiment, the thickness of the photoresist layer 203 may be in a range of approximately 1 µm-10 µm. For example, it may be approximately 1 µm, 2 µm, 3 µm, 4 µm, 5 µm, 6 µm, 7 µm, 8 µm, 9 µm, or 10 µm, etc.

Figure 11:
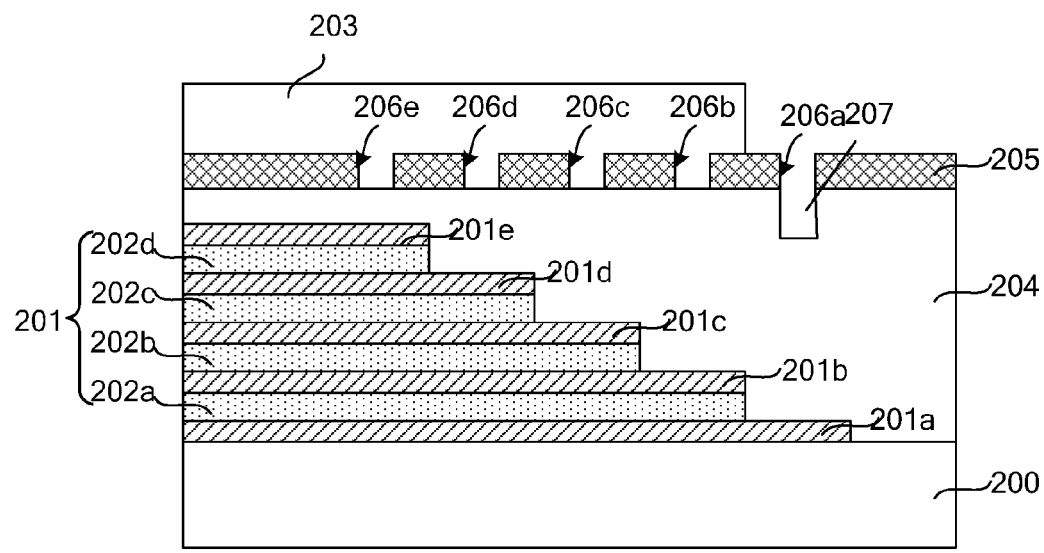

Returning to FIG. 18, after forming the photoresist layer 23, a photoresist trimming process may be performed; and a first hole may be formed (S105). FIG. 11 illustrates a corresponding semiconductor structure.

As shown in FIG. 11, a portion of the photoresist layer 23 is removed; and the opening in the dielectric layer 205 corresponding to the second end of the most bottom layer of the control gate structure 201 may be exposed. The process for removing the portion of the photoresist layer 23 may be referred as a photoresist trimming process.

After removing the portion of the photoresist layer, a first etching process may be performed to removing a partial thickness of the dielectric layer 204 along the exposed opening. Thus, a first hole 207 may be formed in the dielectric layer 24 right above the second end of the most bottom layer of the control gate structure 201.

The photoresist trimming process may be any appropriate process. In one embodiment, the photoresist trimming process is an anisotropic plasma etching process. The photoresist trimming process may utilize oxygen-containing plasma to etch the photoresist layer 203 to expose the opening formed in the hard mask layer 205 right above the second end of the most bottom layer of the control gate structure 201.

In one embodiment, the gas of the plasma etching process for the photoresist trimming process may include $O_2$, etc. The flow rate of $O_2$ may be in a range of approximately 50 sccm-250 sccm. The radio frequency power of the plasma etching process may be in a range of approximately 300 W-800 W. The bias power the plasma etching process may be in a range of approximately 0-10 W. The reaction chamber of the plasma etching process may be in a range of approximately 5 mTorr-50 mTorr. Such process parameters may cause the accuracy of the recessed width of the photoresist to be relatively high; and the corresponding opening may be precisely exposed.

In one embodiment, after the photoresist trimming process, the remaining photoresist layer may expose the first opening 206a of the hard mask layer 205.

Before performing the photoresist trimming process, the photoresist layer 203 may be patterned to form a patterned photoresist layer. The patterned photoresist layer may cover the portion of the hard mask layer 205 having the plurality of openings in the second region and the portion of the hard mask layer 205 between the first region and the second region. The pattern photoresist layer may expose a portion of the hard mask layer 205 at the side of the first opening 206a away from the first end. A plurality of photoresist trimming processes may be subsequently performed to sequentially expose the plurality of openings distributed along a direction from the second end to the first end.

In one embodiment, the photoresist trimming process for exposing the first opening 206a may be referred as a first photoresist trimming process. The first opening 206a may be right above the second end of the bottom layer or the first layer of the control gate 201.

After the first photoresist trimming process, an etching process may be performed along the first opening 206a to remove a partial thickness of the dielectric layer 204. Thus, the a first hole 207 may be formed in the dielectric layer 204 right above the second end of the bottom gate structure, i.e., the first layer of the control gate structure 201. Such an etching process may be referred as a first etching process; and the hole 207 may be referred to as a first a first hole 207.

The depth of the first hole 207 may be smaller than the thickness of the dielectric layer 204. Further, the depth of the first hole 207 may be smaller than the distance among the top surface of the dielectric layer 204 and the surface of the most bottom layer of the control gate 201 divided by the number of the layers of the control gate structure 201. During subsequently repeating the photoresist trimming process and the first etching process, the depth of the first hole 207 may be increased gradually. So the depth of the first hole 207 may be designed such that after subsequently forming a plurality of holes corresponding to all the second ends of control gate structure 201, a second etching process may etch through all the plurality of the hokes simultaneously, or the etching time differences may be substantially small.

Figure 12:
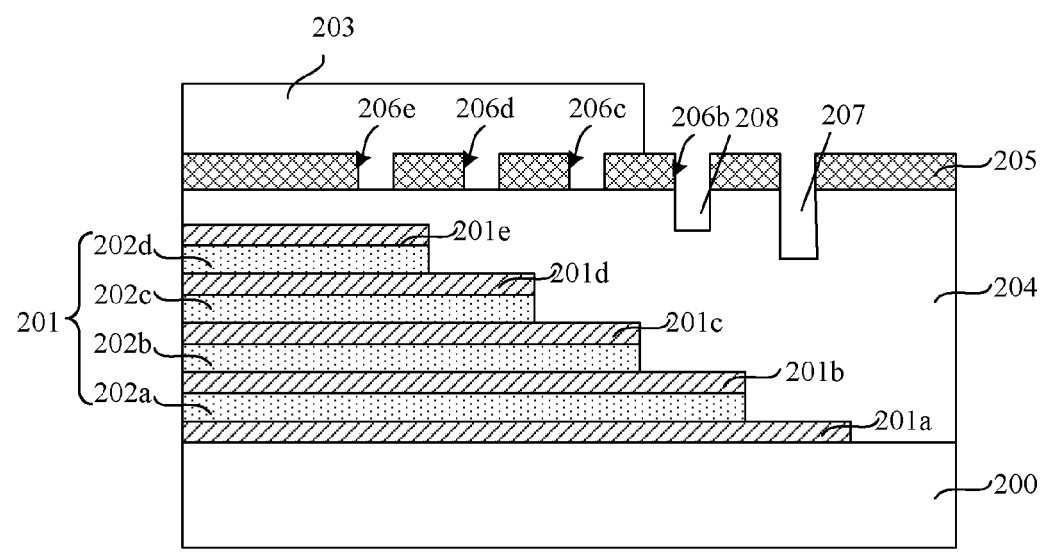
Figure 13:
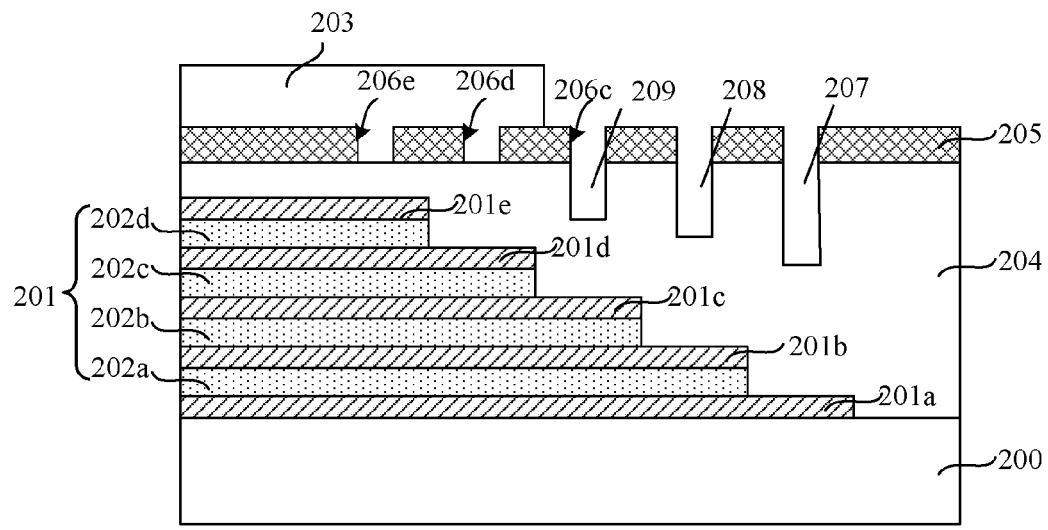
Figure 14:
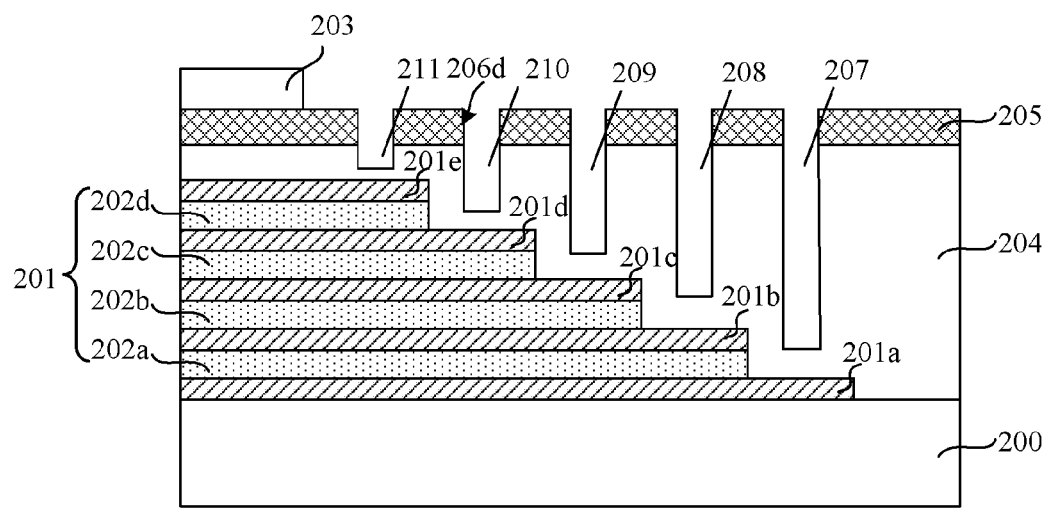

Returning to FIG. 18, after forming the first hole 207, the photoresist trimming process and the first etching process may be repeated (S106). FIGS. 12-14 illustrate corresponding semiconductor structures.

As shown in FIGS. 12-14, the photoresist trimming process and the first etching process may be repeated to sequentially remove portions of the photoresist layer 203 to sequentially expose the plurality of openings formed in the hard mask layer 205 along a direction from the second end to the first end. As the same time, a partial thickness of the dielectric layer 204 along the corresponding openings may be removed; and a plurality of holes distributed along a direction from the first end to the second end may be formed in the dielectric layer 204 right above the control gate structure 201. When each of the first etching processes is performed, the depth of the previously formed holes may be increased.

In one embodiment, the photoresist trimming process and the first etching process may be repeated until the remaining photoresist layer 203 are too thin to cover the hard mask layer 205, and each of the plurality of hole has not yet expose the gate structure 201. A second etching process may be subsequently performed to etch through the plurality holes to form through holes simultaneously to expose the gate structure 201.

Specifically, repeating photoresist trimming process and the first etching process may include performing a second photoresist trimming process to expose the second opening in the hard mask layer 205; and performing a second first etching process to form a second hole in the dielectric layer 204 right above the second end of the second layer of the control gate structure 201. When the second first etching process is performed, the depth of the first hole 207 may be increased. Further, repeating photoresist trimming process and the first etching process may also include preforming an Nth (N≥2) step photoresist trimming process to expose the Nth (N≥2) opening in the hard mask layer 205; and performing an Nth (N≥2) first etching process to remove a partial thickness of the dielectric layer 204 along the Nth opening. Thus, the Nth (N≥2) hole may be formed in the dielectric layer 204 right above the second end the Nth layer of the control gate structure 201. When the Nth first etching process is performed, the depths of the formed holes, from the first hole to the (N−1)th hole, may be increased.

In one embodiment, as shown in FIG. 12, repeating photoresist trimming process and the first etching process may include performing a second photoresist trimming process to expose the second opening 206b in the hard mask layer 205; and performing a second first etching process to remove a partial thickness of the dielectric layer 204 along the second opening 206a. Thus, a second hole 208 may be formed in the dielectric layer 204 right above the second end of the second layer of the control gate structure 201. When the second first etching process is performed, the depth of the first hole 207 may be increased.

Further, as shown in FIG. 13, after forming the second hole 208, a third photoresist trimming process may be performed to expose the third opening 206c in the hard mask layer 205; and a third first etching process may be performed to remove a partial thickness of the dielectric layer 204 along the third opening 206c. Thus, a third hole 209 may be formed in the dielectric layer 204 right above the second end of the third layer of the control gate structure 201. When the third first etching process is performed, the depth of the first hole 207 and the second hole 208 may be increased simultaneously.

Further, as shown in FIG. 14, after forming the third hole 209, a fourth photoresist trimming process may be performed to expose the fourth opening 206d in the hard mask layer 205; and a fourth first etching process may be performed to remove a partial thickness of the dielectric layer 204 along the fourth opening 206d. Thus, a fourth hole 210 may be formed in the dielectric layer 204 right above the second end of the fourth layer of the control gate structure 201. When the fourth first etching process is performed, the depths of the first hole 207, the second hole 208 and the third hole 209 may be increased simultaneously.

Further, after forming the fourth hole 210, a fifth photoresist trimming process may be performed to expose the fifth opening 206e in the hard mask layer 205; and a fifth first etching process may performed to remove a partial thickness of the dielectric layer 204 along the fifth opening 206e. Thus, a fifth hole 211 may be formed in the dielectric layer 204 right above the second end of the fifth layer of the control gate structure 201. When the fifth first etching process is performed, the depth of the first hole 207, the second hole 208, the third hole 209 and the fourth hole 210 may be increased simultaneously.

During the photoresist trimming processes and the first etching processes, the thickness of the photoresist layer 203 may be gradually reduced. Thus, the thickness of the photoresist layer 203 has a predetermined value such that the photoresist layer 203 may be recessed to expose all of the plurality of openings.

The first etching process may be any appropriate process. In one embodiment, an isotropic dry etching process may be used as the first etching process. The etching gas of the isotropic dry etching process may include Ar and fluoride-containing gas, etc. The fluoride-containing gas may include one or more of $CF_4$, $C_2F_6$, and $CHF_3$, etc. The flow rate of Ar may be in a range of approximately 100 sccm-300 sccm. The flow rate of the fluoride-containing gas may be in a range of approximately 10 sccm-250 sccm. The pressure of the reaction chamber of the isotropic dry etching process may be in a range of approximately 50 mTorr-100 mTorr. The temperature of the reaction chamber may be in a range of approximately 20° C.-80° C. The radio frequency power of the plasma of the isotropic dry etching process may be in a range of approximately 300 W-1500 W. The bias power of the plasma may be in a range of approximately 200 W-600 W. Such a parameter combination may cause the formed holes to have a relatively high accuracy; and the uniformity of the distances among the bottoms of the plurality holes and the second ends of the corresponding layers of the control gate structure 201 may be improved.

Figure 15:
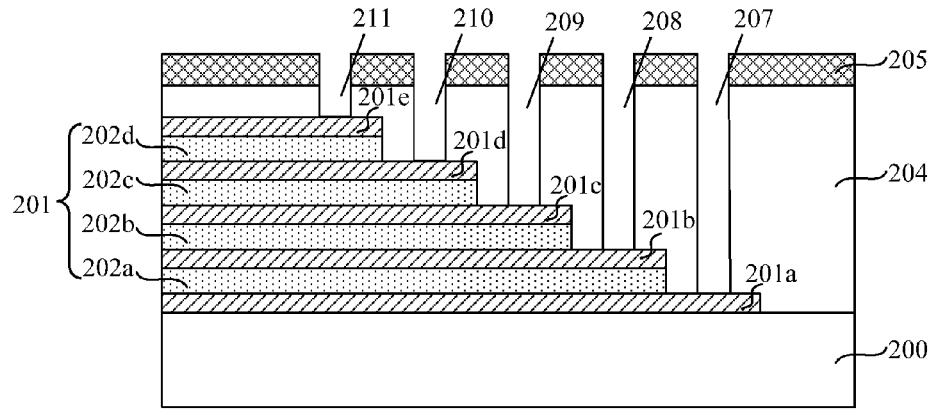

Returning to FIG. 18, after forming the plurality of holes, a second etching process may be performed (S107). FIG. 15 illustrates a corresponding semiconductor structure.

As shown in FIG. 15, a second etching process is performed to remove portions the dielectric layer 204 to increase the depth of the plurality of holes. The second etching process may be performed until the second end of the layer of the control gate structure corresponding to each of the plurality of holes is exposed. Thus, the plurality of holes may become through holes, i.e., the through holes penetrating through the dielectric layer 204.

The second etching process may be any appropriate process, such as a dry etching process, or a wet etching process, etc. In one embodiment, the second etching process is an anisotropic dry etching process. The etching gas of the anisotropic dry etching process may include Ar and fluoride-containing gas. The fluoride-containing gas may include one or more of $CF_4$, $C_2F_6$, and $CHF_3$, etc. The flow rate of Ar may be in a range of approximately 100 sccm-300 sccm. The flow rate of the fluoride-containing gas may be in a range of approximately 10 sccm-250 sccm. The pressure of the reaction chamber of the isotropic dry etching process may be in a range of approximately 50 mTorr-100 mTorr. The temperature of the reaction chamber may be in a range of approximately 20° C.-80° C. The radio frequency power of the plasma of the isotropic dry etching process may be in a range of approximately 400 W-1500 W. The bias power of the plasma may be in a range of approximately 300 W-700 W. Such a parameter combination may cause the formed through holes to have desired side surfaces; and the time for exposing the second end of the layer of the control gate structure 201 corresponding to each of the plurality of through holes may be identical, or similar.

By repeating the photoresist trimming process and the first etching process to form the plurality of holes, the distances among the bottoms of the plurality of holes and the surface of the second ends of the layers of the control gate structure 201 corresponding to the plurality of holes may be identical, or similar. By performing the second etching process, the time for causing the bottoms of the holes (or the through holes) to expose the surfaces of the second ends of the corresponding layers of the control gate structure 201 may be identical, or similar. That is, the time difference for forming the through holes may be substantially small. Thus, the through holes may be finally formed simultaneously, or with substantially time difference. Accordingly, the damage to the layers of the control gate structure 201 exposed by the through holes formed earlier may be avoided.

In one embodiment, when the second etching process is performed, the remaining photoresist layer 203 may be removed. In certain other embodiments, the remaining photoresist layer 203 may be removed by a plasma ashing process after the second etching process.

Returning to FIG. 18, after forming the through holes, a plurality of metal vias may be formed (S108). FIG. 16 illustrates a corresponding semiconductor structure.

As shown in FIG. 16, a metal via is formed in each of the plurality of through holes. That is, a plurality of metal vias (212-216) distributed along a direction from the second end to the first end. Each of the plurality of metal vias may be electrically connected with the surface of the second end of the corresponding layer of the control gate structure 201.

The process for forming the plurality of the metal vias may include forming a metal layer on the hard mask layer 205 and in the plurality of the through holes, followed by planarizing the metal layer and the hard mask layer 205 until the surface of the dielectric layer 204 is exposed. Thus, the plurality of metal vias may be formed in the plurality of through holes.

The plurality of metal vias may include a first metal via filled in the first through hole; a second metal via filled in the second through hole; . . . ; and an Nth (N≥2) metal via filled in the Nth (N≥2) through holes. The first metal via may be electrically connected with the second end of the first layer of the control gate structure 201; the second metal via may be electrically connected with the second end of the second layer of the control gate structure 201; . . . ; and the Nth (N≥2) metal via may be electrically connected with the second end of the Nth (N≥2) layer of the control gate structure 201.

In one embodiment, the metal vias may include the first metal via 212 filled in the first through hole; the second metal via 213 filled in the second through hole; the third metal via 214 filled in the third through hole; the fourth metal via 215 filled in the fourth through hole; and the fifth via 216 filled in the fifth through hole. The first metal via 212 may be electrically connected with the second end of the first layer of the control gate structure 201; the second metal via 213 may be electrically connected with the second end of the second layer of the control gate structure 201; the third metal via 214 may be electrically connected with the second end of the third layer of the control gate structure 201; the fourth metal via 215 may be electrically connected with the second end of the fourth layer of the control gate structure 201; and the fifth metal via 216 may be electrically connected with the second end of the fifth layer of the control gate structure 201.

Thus, a 3D NAND device may be formed by the above-disclosed processes and methods; and the corresponding semiconductor structure is illustrated in FIG. 16. As shown in FIG. 16, the 3D NAND device includes a semiconductor substrate 200. The semiconductor substrate 200 may include a first region (not shown) and at least one second region (not labeled). A multiple-layer stacked memory structures (not shown) may be formed on the semiconductor substrate 200 in the first region; and a control gate structure 201 may be formed on the semiconductor substrate 200 in the second region. The control gate structure 201 may also be a multiple-layer stacked structure; and each layer may include a first end and a second end. The first end of each layer of the control gate structure 201 may be electrically connected with the corresponding layer of memory structures. The second ends of the plurality of layers of the control gate structure 201 may be sequentially step-recessed from the bottom layer to the top layer. Further, the 3D NAND device may include a dielectric layer covering the control gate structure 201 and the semiconductor substrate 200. Further, the 3D NAND device may also include a metal via electrically connected with the second end of each layer of the control gate structure 201. The detailed structures and intermediate structures are described above with respect to the fabrication processes.

According to the disclosed methods and structures, by repeating the photoresist trimming process and the first etching process to form the plurality of holes, the distances among the bottoms of the plurality of holes and the surfaces of the second ends of the layers of the control gate structure corresponding the plurality of holes may be identical, or similar. By performing the second etching process, the time for causing the bottoms of the holes (or through holes) to expose the surfaces of the second ends corresponding to the plurality of holes may be identical, or similar. That is, the time difference for forming the through holes may be substantially small. Thus, the plurality of through holes may be finally formed simultaneously, or with substantially time differences. Accordingly, the damage to second ends of the layers of the control gate structure exposed by the through holes formed earlier may be avoided.

The above detailed descriptions only illustrate certain exemplary embodiments of the present invention, and are not intended to limit the scope of the present invention. Those skilled in the art can understand the specification as whole and technical features in the various embodiments can be combined into other embodiments understandable to those persons of ordinary skill in the art. Any equivalent or modification thereof, without departing from the spirit and principle of the present invention, falls within the true scope of the present invention.

What is claimed is:

1. A method for fabricating a 3D NAND device, comprising:
   providing a semiconductor substrate;
   forming a control gate structure having a plurality of staircase stacked layers and memory structures on the semiconductor substrate, each layer in the control gate structure having a first end and a second end opposing to the first end;
   forming a dielectric layer covering the semiconductor substrate, the memory structures, and the control gate structure;
   forming a hard mask layer on the dielectric layer;
   patterning the hard mask layer to form a plurality of openings above corresponding second ends of the plurality of layers of the control gate structure;
   forming a photoresist layer on the hard mask layer and in the plurality of openings;
   repeating a photoresist trimming process and a first etching process to sequentially expose the plurality of openings, and to form a plurality of holes with predetermined depths in the dielectric layer above the corresponding second ends;
   performing a second etching process to etch the plurality of holes until surfaces of the second ends are exposed to form a plurality of through holes; and
   forming a metal via in the through holes.

2. The method according to claim 1, wherein:
   the semiconductor substrate has a first region and at least one second region;
   the memory structures are multiple-layer stacked, and formed on the semiconductor substrate in the first region;
   the control gate structure is formed on the semiconductor substrate in the second region;
   the plurality of layers of the control gate structure are staircase-stacked structure; and
   each of the plurality of layers of the control gate structure is electrically connected with a corresponding layer of memory structures.

3. The method according to claim 1, wherein forming each of the plurality of holes in the dielectric layer comprises:
   removing a portion of the dielectric layer along the holes by a first etching process; and
   increasing a depth of the holes by following first etching processes.

4. The method according to claim 1, wherein:
   the photoresist trimming process is an anisotropic plasma etching process.

5. The method according to claim 4, wherein:
   an etching gas of the anisotropic plasma etching process includes $O_2$;
   a flow rate of $O_2$ is in a range of approximately 50 sccm-200 sccm;
   a radio frequency power of the plasma is in a range of approximately 300 W-800 W;
   a bias power of the plasma is in a range of approximately 0-10 W; and
   a pressure of a reaction chamber of the plasma etching process is in a range of approximately 5 mTorr-50 mTorr.

6. The method according to claim 1, wherein:
   the first etching process is an isotropic dry etching process.

7. The method according to claim 6, wherein:
   etching gases of the isotropic dry etching process include Ar and fluoride-containing gas;
   the fluoride containing gas includes one or more of $CF_4$, $C_2F_6$, and $CHF_3$;
   a flow rate of Ar is in a range of approximately 100 sccm-300 sccm;
   a flow rate of the fluoride-containing gas is in a range of approximately 10 sccm-250 sccm;
   a radio frequency power of a plasma of the dry etching process is in a range of approximately 300 W-1500 W;
   a bias power of the plasma is in a range of approximately 200-600 W;
   a pressure of a reaction chamber of the dry process is in a range of approximately 50 mTorr-100 mTorr; and a temperature of the reaction chamber is in a range of approximately 20° C.-80° C.

8. The method according to claim 1, wherein:
the hard mask layer is one of a metal hard mask layer and an inorganic hard mask layer.

9. The method according to claim 8, wherein:
the metal hard mask layer is made of metal nitride.

10. The method according to claim 9, wherein:
the metal nitride is one of TiN and TaN.

11. The method according to claim 8, wherein:
the inorganic hard mask layer is made of one of SiN, SiC, SiON, and SiOC.

12. The method according to claim 1, wherein:
a thickness of the photoresist layer is in a range of approximately 1 μm-10 μm.

13. The method according to claim 1, before forming the metal vias in the plurality of through holes, further comprising:

removing remaining photoresist layer on the hard mask layer.

14. The method according to claim 13, forming the metal vias in the through holes further comprises:

forming a metal material layer on the hard mask layer and in the plurality of through holes; and removing portion of the metal layer and the hard mask layer on the dielectric layer by a chemical mechanical polishing process.

15. The method according to claim 1, wherein:

the predetermined depths of the plurality of holes are smaller than distances between a top surface of the dielectric layer and a surface of the most bottom layer of the control gate divided by a layer number of the control gate structure.

* * * * *